United States Patent [19]

Bigelow et al.

[11] Patent Number: 4,669,884
[45] Date of Patent: Jun. 2, 1987

[54] VARIABLE WAVELENGTH OPTICAL ALIGNMENT SYSTEM

[75] Inventors: Mark G. Bigelow; Stephen J. Follis, both of Palm Bay, Fla.

[73] Assignee: Harris Corporation, Melbourne, Fla.

[21] Appl. No.: 792,988

[22] Filed: Oct. 30, 1985

[51] Int. Cl.⁴ .............................................. G01B 11/27
[52] U.S. Cl. ..................................... 356/401; 356/400
[58] Field of Search ....................... 356/399, 400, 401; 250/548, 557, 561

[56] References Cited

U.S. PATENT DOCUMENTS 4,595,295  6/1986  Wilczynski ........................ 356/401

Primary Examiner—Eugene R. LaRoche
Assistant Examiner—Robert J. Pascal
Attorney, Agent, or Firm—Antonelli, Terry & Wands

[57] ABSTRACT

A photomask/wafer alignment apparatus for achieving a high precision alignment of the wafer alignment mark and the photomask window at all stages of photomask patterning employs a variable wavelength light source the optical output frequency of which is selectively controllable, so as to optimize the signal-to-noise ratio of the wafer alignment mark and the photomask alignment window, either under operator control, or through an automatic feedback arrangement. The system also includes a two-dimensional variable aperture plate inserted between the variable wavelength light source and the projection optics for the photomask. This variable aperture plate provides the capability of control both bandwidth and coherence of the variable wavelength light beam emitted from the multi-color light source, thereby optimizing the signal-to-noise ratio of the imaged alignment mark. To maintain a sharp focus of the imaged mark, an adjustable correction lens is inserted in the imaging path between the wafer and the projections/return optics, so as to compensate for changes in focus due to changes in wavelength of the imaging beam.

25 Claims, 2 Drawing Figures

VARIABLE WAVELENGTH OPTICAL ALIGNMENT SYSTEM

FIELD OF THE INVENTION

The present invention relates in general to a photomask alignment apparatus of the type used in the manufacture of semiconductor integrated circuits and is particularly directed to an improved mechanism for maintaining optimum contrast between the monitored image of a wafer alignment mark and adjacent (photomask reticle window) background.

BACKGROUND OF THE INVENTION

In the course of manufacture of semiconductor devices, especially integrated circuits, a series of photomasking steps are conducted for defining prescribed areas or regions on a semiconductor wafer whereat respective patternings of the wafer and the formation of successive layers of circuit defining material are conducted. At each pattern-defining step, a respective photomask must be precisely aligned with the wafer in order to accurately fix the locations of the patterns through which the integrated circuit is formed. Usually, this alignment procedure involves the use of visual keys on the wafer and the mask which are optically aligned with one another through the use of a microscope/TV monitor apparatus. For an overview of a variety of alignment schemes, particularly photomask/wafer alignment mechanisms, attention may be directed to the U.S. Pat. Nos. to Locombat 4,402,610; Wilczynski 4,232,969; Kleinknecht et al 4,211,489; Koizumi et al 4,153,371; Feldman et al 4,037,969; and Pekelsky 4,459,026.

In general such systems are configured in the manner illustrated in FIG. 1, which shows a block diagram of a conventional photomask alignment apparatus. In order to optically view and align the wafer and photomask alignment keys, a beam of light T from a monochromatic light source 10 is projected via a projection/-return optical unit 11 through a window 12W in a photomask 12 and, via reduction optics 13, onto that portion of the surface of semiconductor wafer structure 14 being processed containing the alignment mark 14P. The light is then reflected from the alignment mark 14P on the wafer 14 and returns as a return beam R through the photomask window 12W and projection/return unit 11, to be viewed by an alignment image monitor apparatus 15, usually containing a TV monitor coupled to the output of a microscope, so that the system operator is presented with an image of the superposition of the alignment mark 14P on the wafer 14 and the alignment window 12W formed in the photomask reticle 12. From this composite image of the photomask window 12W and alignment mark 14P, the operator seeks to control the relative positions of the photomask 12 and wafer 14 (e.g. through an X-Y table 18 driven by an X-Y alignment control unit 17 in response to an alignment control input coupled over link 16).

Unfortunately, the composite image of the alignment mark 14P on the wafer 14 and the window 12W in the photomask 12, as monitored by imaging apparatus 15 and viewed by the operator, suffers from a variation in clarity and contrast during the sequence of photomask/-processing steps to which the wafer structure is subjected for manufacturing the intended integrated circuit. This degradation in image quality has been found to be a result of the use of a monochromatic imaging beam for viewing the alignment key or mark on the semiconductor wafer. A typical light source through which alignment of the photomask and the wafer is carried out may have a frequency on the order of 440 nanometers ($\pm 10$–30 nm), so that the light source 10 in the configuration shown in FIG. 1 is effectively monochromatic. As successive layers are formed on wafer 14 through the photomask processing sequence, the monochromatic light beam is subjected to multiple reflections and absorption through the laminate of layers on the wafer surface. Because of this effect by the wafer structure on the imaging beam, the image of the alignment mark 14P on the wafer 14 contained within the composite image of the window 12W and the alignment mark 14P as viewed by the monitor apparatus 15 may suffer a substantial reduction in signal-to-noise ratio, whereby precise location of the alignment mark within the photomask window is extremely difficult or practically impossible to obtain, for the degree of alignment tolerance required. As a result, processing of the wafer through that photomask may not necessarily achieve patterning to the precision necessary for achieving the intended configuration and tolerances of the sought-after integrated circuit.

SUMMARY OF THE INVENTION

In accordance with the present invention, the inability of a conventional mask alignment apparatus to achieve a high precision alignment of the wafer alignment mark and the photomask window at all stages of photomask patterning is overcome by a system which employs a variable wavelength light source and associated bandwidth/coherence control unit, for maximizing the signal-to-noise ratio of the imaged alignment mark for each respective photomask processing step. Pursuant to the present invention, the single color (effectively monochromatic) light source of a conventional photomask alignment apparatus is replaced by a multiple color (variable wavelength) unit the optical output frequency of which is selectively controllable, so as to optimize the signal-to-noise ratio of the wafer alignment mark and the photomask alignment window, either under operator control, or through an automatic feedback arrangement. The system of the invention also includes a two-dimensional variable aperture plate inserted between the variable wavelength light source and the projection optics for the photomask. This variable aperture plate provides the capability of controlling both bandwidth and coherence of the variable wavelength light beam emitted from the multi-color light source, thereby optimizing the signal-to-noise ratio of the imaged alignment mark. To maintain a sharp focus of the imaged mark, an adjustable correction lens is inserted in the imaging path between the wafer and the projections/return optics, so as to compensate for changes in focus due to changes in wavelength of the imaging beam. Because the wavelength of the imaging beam is variable, the signal-to-noise ratio degradation created by the multiple reflections of the laminate structure of the semiconductor wafer is substantially reduced. Thus, regardless of the destructive interference effects created by the laminate structure of the wafer for one particular wavelength, which would otherwise degrade the viewed image of the alignment mark to a point that precise alignment between the photomask and the wafer could not be achieved, the present invention permits adjustment of the wavelength of the imaging beam so that the degree of contrast between the alignment mark and the surrounding reticle window background in the composite image is maximized, thereby affording precise location of the alignment within the viewed photomask window, and thereby precise location of the photomask relative to the semiconductor wafer.

DETAILED DESCRIPTION

Figure 1:
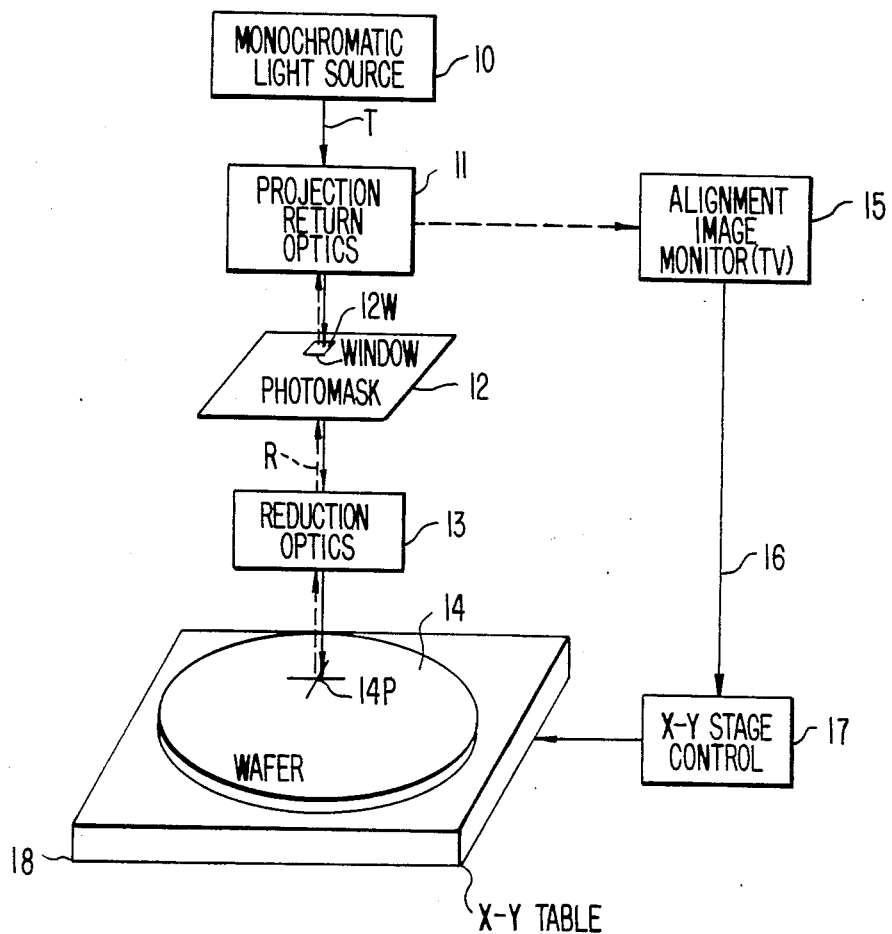
FIG. 1 is a schematic block diagram of a conventional photomask alignment apparatus employing a monochromatic light source.
Figure 2:
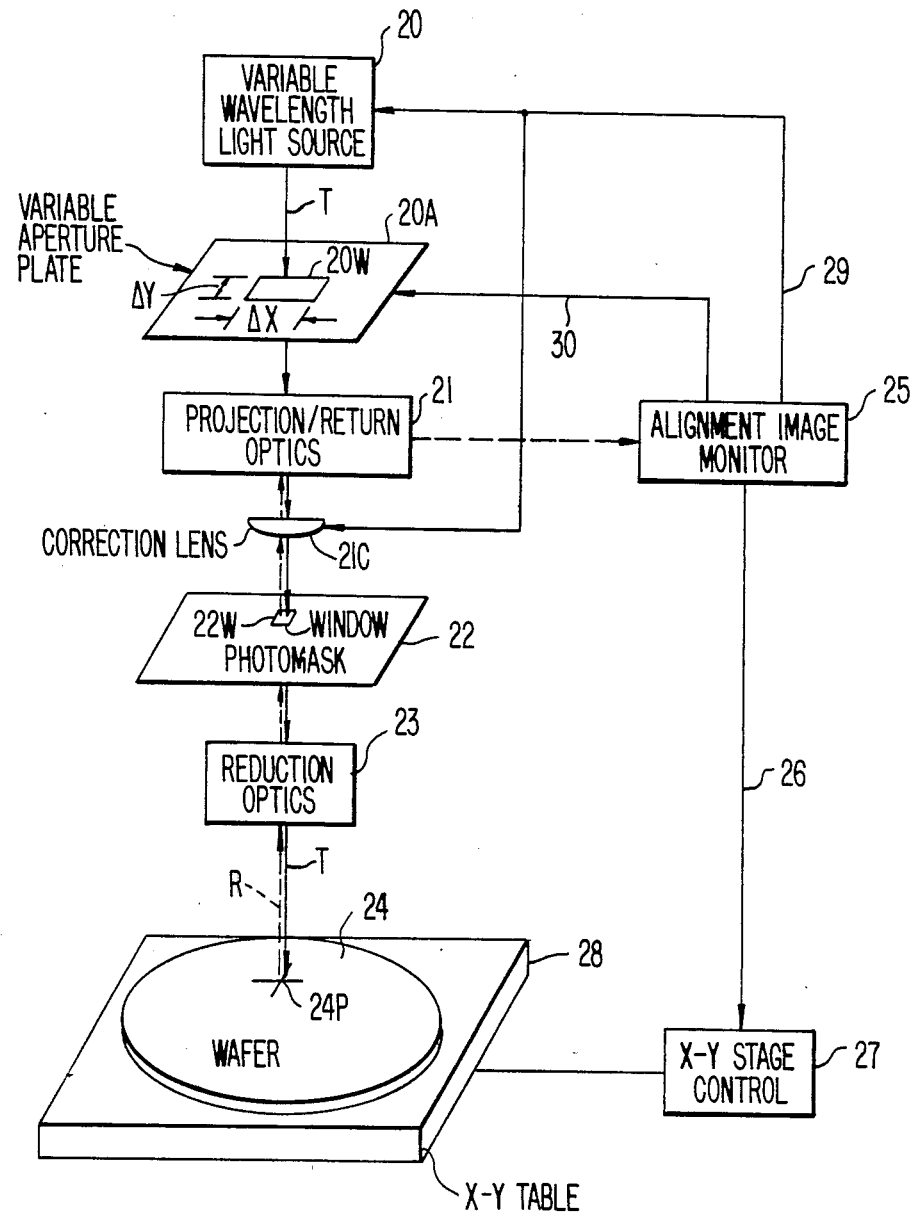
FIG. 2 is a block diagram of a photomask alignment apparatus employing a variable wavelength light source and bandwidth/coherence control mechanism in accordance with the present invention.

Referring now to FIG. 2, there is shown a schematic block diagram of a photomask alignment apparatus according to the present invention. Unlike the conventional system illustrated in FIG. 1, described above, the alignment apparatus of the present invention employs a variable wavelength light source 20 rather than a monochromatic light source. For this purpose, variable wavelength light source 20 may comprise a broadband fiber optic quartz halogen source Model No. 77502 manufactured by Oriel Corporation of Stanford, CT, which provides a continuously variable wavelength narrow band output over a 400-700 nanometer bandwidth. It should be observed, however, that the variable wavelength light source may take on other configurations, such as a broadband tungsten halogen source projected onto a rotatable diffraction grating. Selection of the bandwidth and control of the coherence of the output of the source is accomplished by the insertion of a two-dimensional ($\Delta X, \Delta Y$) variable aperture plate 20A having a variable window 20W into the path of the variable wavelength output beam produced by source 20. The beam produced by the selectively controllable light source 20 is represented by beam T which is directed by projection/return optics unit 21 through a correction lens 21C onto the window 22W of photomask 22. Correction lens 21C is provided to correct for a shift in the focus of the composite image for changes in wavelength produced by source 20. The transmit beam T is then passed through a reduction optics unit 23 and impinges upon an alignment mark 24P on the semiconductor wafer 24 being processed. The return beam R is then expanded through reduction optics unit 23, passes through window 22W in photomask 22 and correction lens 21C and is directed by projection/return optics unit 21 to an alignment image monitor unit 25. Components 21-25 of the system shown in FIG. 2 may comprise the projection, return and TV camera monitor unit portions of a commercially available photomask/wafer alignment unit produced by TRE Corporation.

Shown coupled as outputs of the alignment image monitor unit 25 are control links 29, 30 and 26 for respectively adjusting the wavelength of the variable wavelength light source 20 and the position of correction lens 21C relative to optics 21, the bandwidth and coherence of the beam T as emitted by source 20, and the relative displacement (alignment) of the photomask 22 and wafer 24 (via X-Y table 28). Link 26 corresponds to link 16 in the system shown in FIG. 1, whereby wafer 24 may be displaced by X-Y table 28 to provide alignment between alignment mark 24P on wafer 24 and window 22W in photomask 22. Where variable wavelength light source 20 is a self-contained unit such as the above-mentioned broadband fiber optic quartz halogen source produced by Oriel Corporation, link 29 provides an input signal for adjusting the wavelength of the light beam generated by source 20 and, at the same time, corrects the displacement (along the optical axis of the projection optics 21) of correction lens 21C for changes in wavelength of the output of source 20. Where the variable frequency light source is comprised of a rotatable diffraction grating, link 29 supplies a servo-drive signal for controlling the angle of incidence of the source beam with the grating and thereby the diffraction spread incident on variable aperture plate 20A. Link 30 provides a control signal for selectively adjusting the aperture dimensions ($\Delta X, \Delta Y$) of window 20W, thereby controlling both bandwidth and coherence of the imaging beam T.

Where the system of FIG. 2 is operator controlled, wavelength selection and alignment positioning control are accomplished by tuning source 20 and controlling the X-Y table 28 through which the wafer 24 is positioned relative to the photomask 22. In an alternative embodiment, the electro-optic signal which is supplied to the TV camera normally viewed by the operator may be coupled through an analog-to-digital converter to supply parameter signals for a microprocessor-based control unit through which the control signals are generated. In this instance, the processor evaluates the alignment mark/window image data in terms of signal-to-noise ratio and adjusts the wavelength of source 20 to obtain a maximum reading of the signal-to-noise ratio signal value.

As will be appreciated from the foregoing description, through the use of a variable wavelength light source for imaging the alignment mark and photomask reticle window of a semiconductor wafer/photomask alignment apparatus, the present invention overcomes the often severe reduction in signal-to-noise ratio of conventional alignment schemes during the production of the semiconductor wafer laminate structure. In a conventional apparatus, wherein the light source is monochromatic, the multiple reflections of the multiple layer laminate structure of the wafer being processed may reduce the contrast between the imaged alignment mark and the reticle window to such an extent that precise alignment of the photomask and the wafer being processed cannot be achieved to the degree of tolerance necessary for obtaining the required yield of the integrated circuit. Pursuant to the present invention, however, because of the wavelength of the light source providing the imaging beam is continuously variable, for each successive photomask step, the variable wavelength light source is scanned (in terms of frequency) while monitoring the superpositioned image of the alignment mark and the photomask window until a maximum contrast between the mark and surrounding background image (in terms of signal-to-noise ratio) is achieved. The frequency (wavelength) at which this maximum is achieved may vary from photomask to photomask due to the above-mentioned multiple internal reflection properties of the semiconductor wafer laminate structure. Yet, regardless of the latter effect, it has been found that by having the ability to vary the bandwidth of the light source over a range of wavelengths of the order referenced above, (e.g. 400-700 nm) a high degree of contrast between the alignment mark and the surrounding background may be maintained, thereby permitting the positioning apparatus to accurately align each photomask and the wafer being processed within the tolerances required for semiconductor integrated circuit manufacture.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. An apparatus for optically aligning a first workpiece relative to a second workpiece, said first workpiece containing a first alignment key and said second workpiece containing a second alignment key comprising:

first means for producing an output light beam the wavelength of which is controllable;

second means for causing said output light beam to mutually image said first and second alignment keys of said first and second workpieces, respectively, and for deriving therefrom an output representative of the composite image of said first and second alignment keys as imaged by said light beam; and third means for controlling the wavelength of the output light beam produced by said first means in accordance with a prescribed characteristics of the output derived by said second means representative of the composite image of said first and second alignment keys.

2. An apparatus according to claim 1, wherein said first workpiece comprises a photomask employed for patterning a semiconductor substrate structure and said second workpiece comprises a semiconductor substrate structure.

3. An apparatus according to claim 2, wherein said first alignment key comprises a window provided in said photomask through which said output light beam produced by said first means is caused to pass by said second means, and said second alignment key comprises an alignment mark disposed on said semiconductor substrate structure upon which said output light beam produced by said first means and passing through the window in said photomask is directed by said second means.

4. An apparatus according to claim 1, wherein said first means includes means for adjusting the coherence of said output light beam.

5. An apparatus according to claim 1, wherein said first means includes means for adjusting the bandwidth of said output light beam.

6. An apparatus according to claim 5, wherein said first means includes means for adjusting the coherence of said output light beam.

7. An apparatus according to claim 1, wherein said second means includes means for adjusting the composite image of said first and second alignment keys in accordance with the control by said third means of the wavelength of the output beam produced by said first means.

8. An apparatus according to claim 7, wherein said second means includes means for controlling the focus of said composite image of said first and second alignment keys in accordance with the control by said third means of the wavelength of the output beam produced by said first means.

9. An apparatus according to claim 3, wherein said first means includes means for adjusting the coherence of said output light beam.

10. An apparatus according to claim 3, wherein said first means includes means for adjusting the bandwidth of said output light beam.

11. An apparatus according to claim 10, wherein said first means includes means for adjusting the coherence of said output light beam.

12. An apparatus according to claim 3, wherein said second means includes means for controlling the focus of the composite image of said window and said alignment mark in accordance with the control by said third means of the wavelength of the output beam produced by said first means.

13. An apparatus according to claim 6, wherein said second means includes means for controlling the focus of the composite image of said window and said alignment mark in accordance with the control by said third means of the wavelength of the output beam produced by said first means.

14. A method for optically aligning a first workpiece relative to a second workpiece, said first workpiece containing a first alignment key and said second workpiece containing a second alignment key comprising the steps of:

(a) generating a light beam the wavelength of which is variable;

(b) causing said light beam to mutually image said first and second alignment keys of said first and second workpieces, respectively, and deriving therefrom an output representative of the composite image of said first and second alignment keys as imaged by said light beam; and (c) adjusting the wavelength of the light beam generated in step (a) in accordance with a prescribed characteristic of the output derived in step (b) representative of the composite image of said first and second alignment keys.

15. A method according to claim 14, wherein said first workpiece comprises a photomask employed for patterning a semiconductor substrate structure and said second workpiece comprises a semiconductor substrate structure.

16. A method according to claim 15, wherein said first alignment key comprises a window provided in said photomask through which said light beam produced in step (a) is caused to pass in step (b), and said second alignment key comprises an alignment mark disposed on said semiconductor substrate structure upon which said light beam generated in step (a) and passing through the window in said photomask is directed in step (b).

17. A method according to claim 14, wherein said step (a) comprises adjusting the coherence of said light beam.

18. A method according to claim 14, wherein said step (a) adjusting the bandwidth of said light beam.

19. A method according to claim 18, wherein said step (a) comprises adjusting the coherence of said light beam.

20. A method according to claim 14, wherein step (b) comprises adjusting the composite image of said first and second alignment keys in accordance with the adjustment in step (c) of the wavelength of the light beam generated in step (a).

21. A method according to claim 20, wherein step (b) comprises controlling the focus of said composite image of said first and second alignment keys in accordance with the adjustment in step (c) of the wavelength of the light beam generated in step (a).

22. A method according to claim 16, wherein step (a) comprises adjusting the coherence of said light beam.

23. A method according to claim 16, wherein step (a) comprises adjusting the bandwidth of said light beam.

24. A method according to claim 23, wherein step (a) comprises adjusting the coherence of said light beam.

25. A method according to claim 16, wherein step (b) comprises controlling the focus of the composite image of said window and said alignment mark in accordance with the adjustment in step (c) of the wavelength of the light beam generated in step (a).

* * * * *